(12) United States Patent
Otsuka et al.

(10) Patent No.: US 7,491,983 B2
(45) Date of Patent: Feb. 17, 2009

(54) NITRIDE-BASED SEMICONDUCTOR DEVICE OF REDUCED CURRENT LEAKAGE

(75) Inventors: Koji Otsuka, Niiza (JP); Nobuo Kaneko, Niiza (JP)

(73) Assignee: Sanken Electric Co., Ltd. (JP)

( * ) Notice: Subject to any disclaimer, the term of this patent is extended or adjusted under 35 U.S.C. 154(b) by 541 days.

(21) Appl. No.: 11/357,567

(22) Filed: Feb. 17, 2006

(65) Prior Publication Data

US 2006/0138457 A1 Jun. 29, 2006

Related U.S. Application Data

(63) Continuation of application No. PCT/JP2004/012058, filed on Aug. 23, 2004.

(30) Foreign Application Priority Data

Sep. 5, 2003 (JP) ............................. 2003-313742

(51) Int. Cl.
*H01L 21/00* (2006.01)
(52) U.S. Cl. ...................... 257/183; 257/192; 257/194; 438/39; 438/40
(58) Field of Classification Search ................. 257/183, 257/192, 194, 613, E29.249; 438/39, 40
See application file for complete search history.

(56) References Cited

U.S. PATENT DOCUMENTS 7,033,854 B2 *  4/2006  Morita ......................... 438/40
2005/0161704 A1 *  7/2005  Hoshi et al. .................. 257/192

FOREIGN PATENT DOCUMENTS

| EP | 0124256 A1 | 3/1984 |
| JP | 59-177970 A | 10/1984 |
| JP | 2003-059948 A | 2/2003 |

* cited by examiner

*Primary Examiner*—Zandra Smith
*Assistant Examiner*—Paul E Patton
(74) *Attorney, Agent, or Firm*—Woodcock Washburn LLP

(57) ABSTRACT

A high electron mobility transistor is disclosed which has a double-layered main semiconductor region formed on a silicon substrate via a multilayered buffer region. The multilayered buffer region is in the form of alternations of an aluminum nitride layer and a gallium nitride layer. The main semiconductor region, buffer region, and part of the substrate taper as they extend away from the rest of the substrate, providing slanting side surfaces. An electroconductive antileakage overlay covers these side surfaces via an electrically insulating overlay. Electrically coupled to the silicon substrate via a contact electrode, the antileakage overlay serves for reduction of current leakage along the side surfaces.

10 Claims, 4 Drawing Sheets

NITRIDE-BASED SEMICONDUCTOR DEVICE OF REDUCED CURRENT LEAKAGE

CROSS REFERNCE TO RELATED APPLICATIONS

This is a continuation of Application PCT/JP2004/012058, filed Aug. 23, 2004, which claims priority to Japanese Patent Application No. 2003-313742 filed Sep. 5, 2003.

BACKGROUND OF THE INVENTION

This invention relates to semiconductor devices, particularly to those of the class employing nitrides or nitride-based compounds as semiconductors, as typified by metal semiconductor field-effect transistors (MESFETs) and high electron mobility transistors (HEMTs), and more particularly to means in such semiconductor devices for reduction of leakage current to a minimum.

The gallium-nitride-based semiconductor devices have been known and used extensively which have the gallium-nitride-based semiconductor region formed on a sapphire substrate via a buffer region. The sapphire substrate had, however, a weakness of being difficult of dicing for its hardness, in addition to being expensive. These shortcomings of the sapphire substrate are absent from the substrate of silicon or silicon compound suggested by Japanese Unexamined Patent Publication No. 2003-59948.

As taught also by the unexamined patent application above, a multilayered buffer region is interposed between the silicon or silicon-based substrate and the nitride-based semiconductor region (hereinafter referred to as the main semiconductor region) constituting the main working part of the semiconductor device. The buffer region is in the form of alternations of two different kinds of buffer layers such for instance as $Al_xGa_{1-x}N$, where the suffix x is a numeral that is greater than zero and equal to or less than one, and GaN. The multilayered buffer region has proved conducive to improvements in crystallinity and flatness of the main semiconductor region grown epitaxially thereon.

There have, however, been some problems left unresolved with the gallium-nitride-based semiconductor devices of the kind having the multilayered buffer region on a silicon substrate. The gallium-nitride-based main semiconductor region on the multilayered buffer region has a thickness limited by the spacing between the drain and source electrodes formed on the main semiconductor region. For example, for an interelectrode distance of five to 20 micrometers or so, the thickness of the main semiconductor region is only about 0.2 to 3.0 micrometer. Additionally, due to the heterojunctions between the $Al_xGa_{1-x}N$ layers and GaN layers of the multilayered buffer region, what is known to the specialists as two-dimensional electron gas is generated in the GaN layers, with a consequent drop in the resistance of these layers. What is more, being so thin, the $Al_xGa_{1-x}N$ layers are easy to give rise to the quantum-mechanical tunnel effect.

Let us suppose for instance a gallium-nitride-based HEMT of the above outlined prior art design. Leakage current (indicated at $I_A$ in FIG. 1 of the drawings attached hereto) was easy to flow between the drain and source of the HEMT via the multilayered buffer region and silicon substrate during the nonconducting periods of the device when the channel layer overlying the electron transit layer of the main semiconductor region was closed by the depletion layer under the gate. The leakage current caused a rise in the potential of the silicon substrate, with a corresponding increase in potential difference between the substrate and the source. The increased potential difference caused electric field concentrations on the sides of the substrate, buffer region, and main semiconductor region. It must also be taken into consideration that the sides of the substrate, buffer region, and main semiconductor region are not necessarily good in crystallinity, being both exposed and affected by dicing. The HEMT was therefore susceptible to breakdown as a result of field concentrations at the sides of the buffer region and main semiconductor region.

Moreover, in addition to the noted leakage current between drain and source via the substrate and buffer region, there was another path for current leakage (indicated at $I_B$ in FIG. 1) along the relatively low-resistance sides of the HEMT or like semiconductor device. Thus an inconveniently large amount of total leakage current (sum of $I_A$ and $I_B$) existed between drain and source. The usual practice in the semiconductor industry is to assess the drain-source voltage-withstanding capabilities of HEMTs and like devices in terms of the magnitude of current leakage. The larger the amount of current leakage in each such device, the lower is the assessment of the voltage-withstanding capability of that device. Leakage current is itself objectionable because it may lead to the breakdown of the device.

The foregoing difficulties are most pronounced in conjunction with the gallium-nitride-based semiconductor devices of the kind having their main semiconductor regions formed on silicon substrates, which are low in electric resistance, via the multilayered buffer regions. The same problems may, however, manifest themselves with gallium-nitride-based semiconductor devices in which the main semiconductor regions are grown on sapphire substrates via a low-temperature-grown buffer region, as well as those using silicon carbide substrates. Not only HEMTS, moreover, but other semiconductor devices having at least two electrodes directly overlying the main semiconductor region, too, are likely to suffer similar difficulties.

SUMMARY OF THE INVENTION

The present invention seeks to reduce current leakage in nitride-based semiconductor devices of the kind in question.

Briefly, the invention may be summarized as a nitride-based semiconductor device of reduced current leakage suitable for use as a HEMT or MESFET, among other applications. Included is a main semiconductor region having at least one nitride-based semiconductor layer formed on a major surface of a substrate via a buffer region. A set of electrodes are formed on the main semiconductor region. The invention features a first antileakage overlay of electrically insulating material covering at least either of the side surfaces of the main semiconductor region and the buffer region, and a second antileakage overlay of electroconductive material covering at least either of the side surfaces of the main semiconductor region and the buffer region via the first antileakage overlay.

Preferably, as in all the embodiments of the invention to be presented subsequently, the main semiconductor region and the buffer region, as well as part of the substrate, taper as they extend away from the rest of the substrate, providing the side surfaces that are angled with respect to the major surface of the substrate. The conductive overlay covers these slanting side surfaces via the insulating overlay.

The conductive overlay should desirably be held at a constant potential in use of the semiconductor device. To this end the conductive overlay may be electrically coupled to either the substrate, the buffer region, the main semiconductor region, one of the electrodes, or an external source of constant potential.

Held against the side surfaces of at least either of the main semiconductor region and the buffer region, the insulating and the conductive overlay drastically reduce the amount of leakage current flowing along the side surfaces. The insulating overlay itself reduces current leakage by guarding the sides of the main semiconductor region and/or buffer region. Additionally, by virtue of the combination of the insulating and the conductive overlay, not only are electric field concentrations at the sides mitigated, but also depletion layers are created to make the sides higher in electric resistance. The result is a substantive curtailment of current leakage along the sides, which is tantamount to improvements in voltage- and breakdown-withstanding characteristics of the device.

The above and other objects, features and advantages of this invention will become more apparent, and the invention itself will best be understood, from a study of the following description and appended claims, with reference had to the attached drawings showing some preferable embodiments of the invention.

DESCRIPTION OF THE PREFERRED EMBODIMENTS

The nitride-based semiconductor device according to the invention will now be described more specifically in terms of the HEMT shown in FIGS. 1-3 of the attached drawings. The exemplified HEMT broadly comprises:

1. A generally flat, electroconductive silicon substrate 1.
2. A multilayered buffer region 2 (shown in detail in FIG. 3) overlying one of the pair of opposite major surfaces of the silicon substrate 1, leaving an annular marginal part of that one major surface exposed.
3. A main semiconductor region 3 constituted of two different nitride layers grown epitaxially on the multilayered buffer region 2 and constituting the main working part of the HEMT.
4. A first electrode or source 4 (shown in both FIGS. 1 and 2) formed directly atop the main semiconductor region 3 and extending linearly.
5. A second electrode or drain 5 also formed directly atop the semiconductor region 3 and extending in parallel spaced relationship to the source 4.
6. A control electrode or gate 6 also formed directly atop the main semiconductor region 3 and disposed between source 4 and drain 5 in parallel spaced relationship thereto.
7. A first antileakage overlay 7 of electrically insulating material covering, among others, the lateral surfaces of the multilayered buffer region 2 and main semiconductor region 3.
8. A second antileakage overlay 8 of electroconductive material mostly overlying the first antileakage overlay 7.
9. A contact electrode 9 of annular shape formed on the exposed marginal part of the top surface of the silicon substrate 1 in order to assure low-resistance contact of the electroconductive second antileakage overlay 8 with the substrate.
10. A bonding metal layer 10 for use in bonding the HEMT to a baseplate or like mechanical support, not shown in FIGS. 1-3.

The substrate 1 is of monocrystalline n-type silicon, doped with a conductivity-type determinant of phosphorus or like Group V element to gain the n-type conductivity. Generally flat and rectangular in shape, the substrate 1 has a pair of opposite major surfaces 11 and 12. The major surface 11 of the substrate 1, on which is formed the multilayered buffer region 2, is exactly (111) in terms of Miller indices. The substrate 1 has an impurity concentration ranging from $1 \times 10^{13}$ to $1 \times 10^{16}$ cm$^{-3}$ and a relatively high resistivity of from 1.0 to 1000 ohm-centimeters. The substrate 1 should be sufficiently thick (e.g. 350 micrometers) to provide a mechanical support for the multilayered buffer region 2 and main semiconductor region 3.

Figure 3:
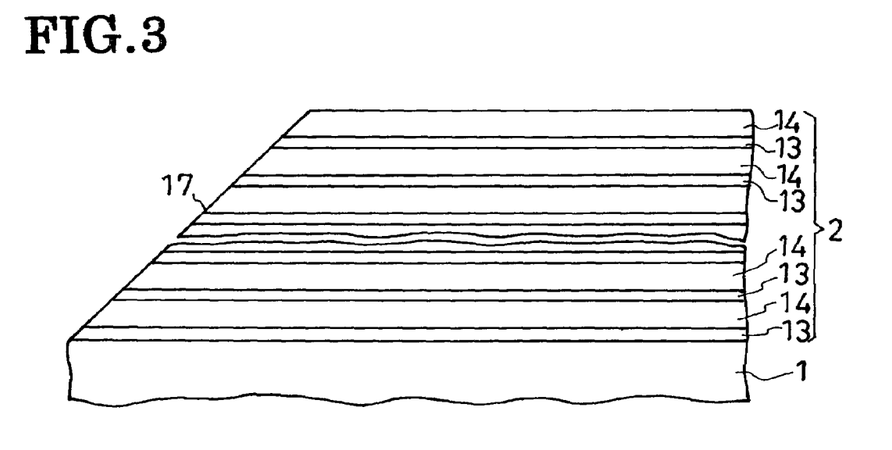
FIG. 3 is an enlarged, fragmentary side view showing in more detail the multilayered buffer region of the HEMT of FIG. 1.

As pictured in detail in FIG. 3, the buffer region 2 is a lamination of alternating first buffer layer 13 and second buffer layer 14 of different compositions. Typically, the buffer region 2 has twenty first buffer layers 13 and as many second buffer layers 14.

The first layers 13 of the buffer region 2 are made from any of the nitrides that are generally defined by the formula:

where M is at least either of indium and boron; the subscript x is a numeral that is greater than zero and equal to or less than one; the subscript y is a numeral that is equal to or greater than zero and less than one; and the sum of x and y is equal to or less than one. Preferred nitrides for the first buffer layers 13, all encompassed by the general formula above, include aluminum nitride (AlN), aluminum gallium nitride (AlGaN), aluminum indium gallium nitride (AlInGaN), aluminum boron gallium nitride (AlBGaN), aluminum indium boron gallium nitride (AlInBGaN), aluminum indium nitride (AlInN), aluminum boron nitride (AlBN), and aluminum indium boron nitride (AlInBN).

Since the subscript y can be zero in the formula above, the first buffer layers 13 may contain neither indium or boron. In that case the nitrides employable for the first buffer layers 13 may be redefined as:

where the subscript x is as defined above. The substances that meet this redefinition are AlN and AlGaN. Gallium is also absent from the composition of the first buffer layers 13 if x=1, leaving only AlN as a possible material therefor. The first buffer layers 13 are made from AlN (x=1, y=0) in this particular embodiment.

So thin and fairly electrically insulating, the first buffer layers 13 are closer in both lattice constant and thermal expansion coefficient to the silicon substrate 1 than the second buffer layers 14. Optionally, either an n- or p-type conductivity determinant might be added to the first buffer layers 13.

The second layers 14 of the buffer region 2 have any of the compositions that are generally expressed by the formula:

$$Al_aM_bGa_{1-a-b}N$$

where M is at least either of indium and boron; the subscript a is a numeral that is equal to or greater than zero and equal to or less than one; the subscript b is a numeral that is equal to or greater than zero and less than one; and the sum of a and b is equal to or less than one.

The nitrides meeting the above definition of the general composition of the second buffer layers 14 include gallium nitride (GaN), aluminum gallium nitride (AlGaN), aluminum indium gallium nitride (AlInGaN), aluminum boron gallium nitride (AlBGaN), aluminum indium boron gallium nitride (AlInBGaN), aluminum indium nitride (AlInN), aluminum boron nitride (AlBN), aluminum indium boron nitride (AlInBN), indium gallium nitride (InGaN), boron gallium nitride (BGaN), indium boron gallium nitride (InBGaN), indium nitride (InN), boron nitride (BN), and indium boron nitride (InBN).

Since the subscript b can be zero in the formula above generally expressing the possible compositions of the second buffer layers 14, these layers may contain neither boron or indium. The general composition of the second buffer layers 14 may then be redefined as:

$$Al_aGa_{1-a}N$$

where the subscript a is as defined above. If a is also zero, then only GaN is left for the second buffer layers 14. Aluminum may be added only in such proportions that a is less than 0.8, in order to preclude cracking as a result of overdosage. The second buffer layers 14 are made from GaN (a=0, b=0) in this particular embodiment. Optionally, either an n- or p-type conductivity determinant might be added to the second buffer layers 14.

The first layers 13 of the buffer region 2 should each be from about 0.5 to about 50 nanometers thick to provide a quantum-mechanical tunnel effect. If they were less than about 0.5 nanometer thick, the main semiconductor region 3 might not be created on the resulting buffer region 2 with a desired degree of flatness. Should they be more than about 50 nanometers thick, on the other hand, then cracking might occur from a lattice mismatch between the first and the second buffer layers 13 and 14 and from the tensile straining of the first buffer layers due to a difference in thermal expansion coefficient between the substrate 1 and the first buffer layers 13.

The second layers 14 of the buffer region 2 should each be from about 0.5 to about 200 nanometers thick. If they were less than about 0.5 nanometer thick, the first buffer layers 13 might not be grown flat enough thereon, nor might the main semiconductor region 3 be formed flat enough on the resulting multilayered buffer region 2. On the other hand, should they be more than about 200 nanometers thick, the main semiconductor region 3 might be adversely affected, with a consequent deterioration of HEMT performance, by compressive stresses exerted on the second buffer layers 14 as a result of a lattice mismatch between the first and the second buffer layers 13 and 14. Preferably, the second buffer layers 14 should each be thicker than each first buffer layer 13. The straining of the first buffer layers 13 due to a lattice mismatch with the second buffer layers 14 and to a different thermal expansion coefficient from that of the substrate 1 will then be reduced to such a level that the first buffer layers will not crack. No deterioration of HEMT performance will then occur, either.

Figure 1:
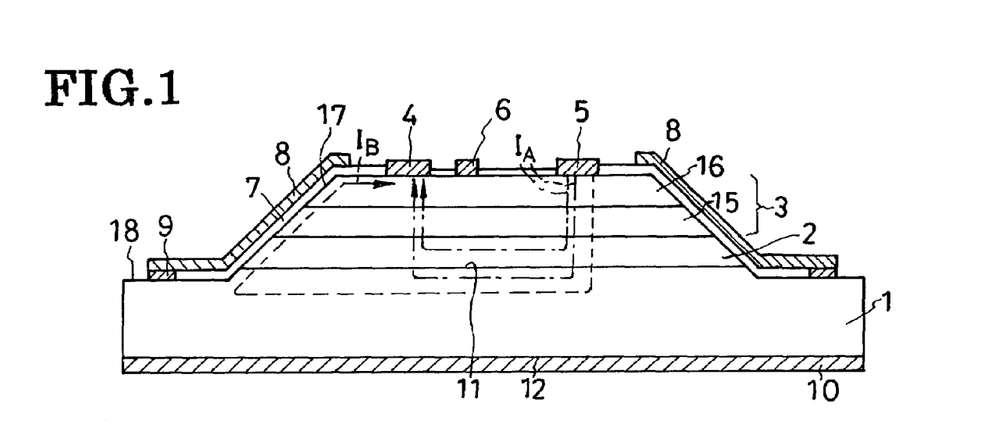
FIG. 1 is a schematic sectional illustration of a HEMT built on the novel principles of the invention.

With continued reference to FIG. 1 the main semiconductor region 3 is shown as a lamination of an electron transit layer 15 of undoped GaN and an electron supply layer 16 of undoped $Al_{0.2}Ga_{0.8}N$ in order to provide a HEMT. Directly overlying the buffer region 2, the electron transit layer 10 (sometimes referred to as channel layer or two-dimensional electron gas layer) of the main semiconductor region 3 is approximately 500 nanometers thick. It is not doped with a conductivity type determinant.

As the name implies, the electron supply layer 16 supplies electrons to the underlying electron transit layer 15. Made from a nitride different from that of the electron transit layer 15, the electron supply layer 16 creates a heterojunction at its interface with the electron transit layer. The electron supply layer 16 is thinner than the electron transit layer 15. Although undoped with a conductivity type determinant, the electron supply layer 16 is of n-like conductivity, behaving like an n-type semiconductor. An n-type impurity such as silicon might nevertheless be doped to the electron supply layer 16 as required.

The first and the second layers 13 and 14 of the buffer region 2, and the electron transit layer 15 and electron supply layer 16 of the main semiconductor layer 3, are all successively grown epitaxially on the silicon substrate 1 by the known metal organic chemical vapor deposition (MOCVD) method. Both buffer region 2 and main semiconductor region 3 are grown at a temperature above 1000° C. (e.g. 1120° C.).

Figure 2:
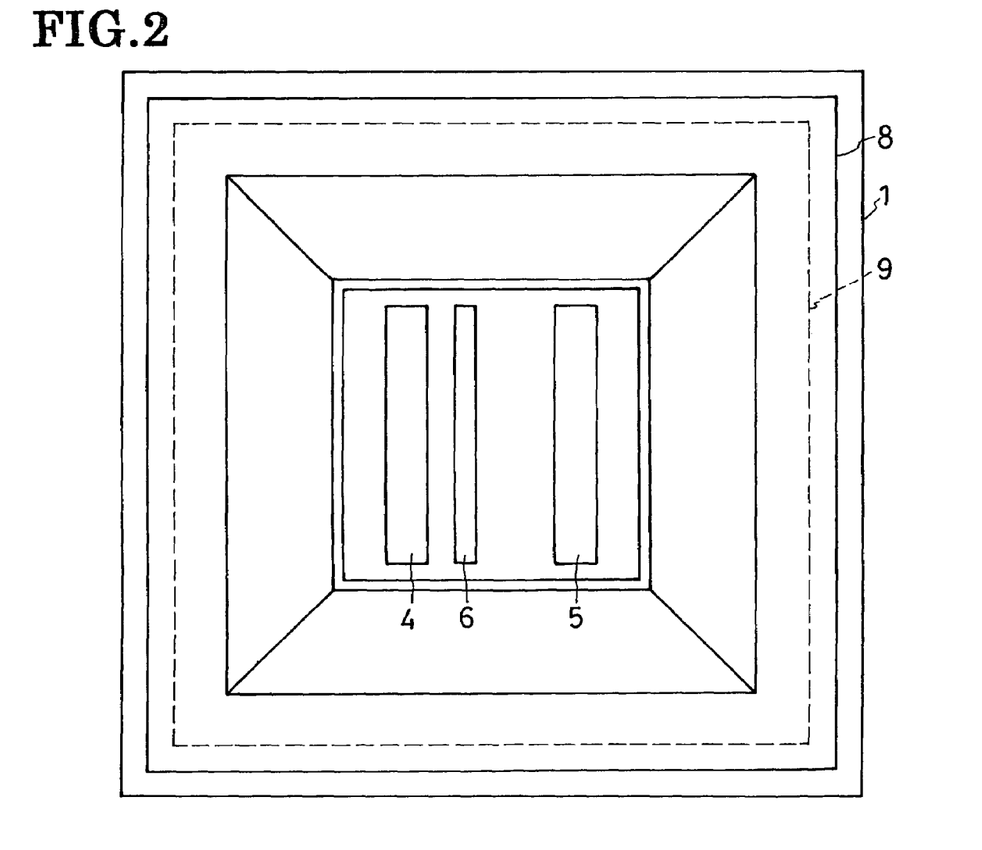
FIG. 2 is a top plan of the HEMT of FIG. 1.

As depicted in both FIGS. 1 and 2, the source 4 and drain 5 make ohmic contact with the electron supply layer 16 of the main semiconductor region 3 whereas the gate 6 makes Schottkey contact therewith. Optionally, a contact layer, not shown, of high n-type impurity concentration might be interposed between the source 4 and drain 5 and the electron supply layer 12. It is also possible to provide a spacer layer, not shown, of undoped AlGaN or AlN between electron transit layer 15 and electron supply layer 16 in cases where an n-type impurity is introduced into the electron supply layer. The spacing between drain 5 and gate 6 is greater than the thickness of the main semiconductor region 3.

It will be observed from both FIGS. 1 and 2 that part of the substrate 1, the multilayered buffer region 2 and the main semiconductor region 3 taper as they extend away from the substrate. The taper is created by etching after the growth of the buffer region 2 and main semiconductor region 3 on the substrate 1. The slanting sides 17 of the part of the substrate 1, the multilayered buffer region 2 and the main semiconductor region 3 may have an angle of 20 to 70 degrees to the major surface 11 of the substrate.

The insulating, or dielectric, first antileakage overlay 7 covers the complete slanting sides 17 as well as annular peripheral part of the top surface of the main semiconductor region 3 and part of the annular ledge 18 of the substrate 1. Preferred materials of the first antileakage overlay 7 include silicon oxide ($SiO_2$), silicon nitride ($SiN_x$ where the subscript x is a numeral between zero and one), and aluminum oxide ($Al_2O_3$). The first antileakage overlay 7 if made too thick would prevent the overlying second antileakage overlay 8 from providing a desired field-mitigating effect. If too thin, however, the first antileakage overlay 7 might be ruptured or at least permit current leakage. All such risks will in general be precluded by making the first antileakage overlay 7 from about 0.1 to about 1.0 micrometer thick. In practice the thickness of the first antileakage overlay 7 may be determined in additional consideration of its dielectric constant.

Overlying the first antileakage overlay 7, the second antileakage overlay 8 is made from metal such as nickel or other electroconductive material in sheet form. The second antileakage overlay 8 covers the complete slanting sides 17 of part of the substrate 1, the multilayered buffer region 2 and the main semiconductor region 3 via the first antileakage overlay 7. Additionally, the second antileakage overlay 8 overlies the annular ledge 18 of the substrate 1, making electrical contact with the annular contact electrode 9 thereon.

The contact electrode 9, typically in the form of a lamination of titanium and nickel layers, makes good ohmic contact wit the ledge 18 of the substrate 1. The second antileakage overlay 8 is therefore in low resistance contact with the substrate 1 via the contact electrode 9 and so at approximately the same potential with the substrate. Being itself practically constant in potential, the substrate 1 serves to hold the second antileakage overlay 8 at the constant potential. The contact electrode 9 functions for better electric contact between the substrate 1 and the second antileakage overlay 8.

Formed on the bottom surface 12 of the substrate 1 is the layer 10 of a metal that is thermally fusible for a firm union with a like or unlike metal. The metal layer 10 is used in bonding the HEMT to a baseplate or like mechanical support.

In the operation of the HEMT constructed as described hereinabove with reference to FIGS. 1-3, a channel-creating control voltage is to be applied between source 4 and gate 6. Further, upon application of a prescribed drive voltage between source 4 and drain 5, current will flow from source to drain. The electron supply layer 16 of the main semiconductor region 3 is so thin that it functions as insulator in its transverse directions and as conductor in its thickness direction. Consequently, the current flows from source 4 to drain 5 via the electron supply layer 16, electron transit layer 15 and back to electron supply layer 16. This current flow from source 4 to drain 5 is controllable by the control voltage impressed to the gate 6.

The current flowing transversely of the electron transit layer 15 will become zero or nearly so when a voltage is impressed to the gate 6 to turn off the channel in the electron transit layer. At this time, however, as indicated by the dot-and-dash lines in FIG. 1, the leakage current $I_A$ will flow from drain 5 to source 4 via the buffer region 2 and, additionally, via the substrate 1. The buffer region 2 contains as aforesaid the heterojunctions between the first layers 13 of AlN and the second layers 14 of GaN. Therefore, as the second buffer layers 14 diminish in electric resistance as a result of two-dimensional electron gas generated therein, current leakage will occur transversely of the second buffer layers. Current leakage will also occur through the silicon substrate 1, it being electroconductive. The leakage current $I_A$ indicated in FIG. 1 represent only these two current components flowing relatively deep inside the main semiconductor region 3, buffer region 2, and substrate 1.

Additionally, as indicated by the dashed line labeled $I_B$ in FIG. 1, there exists still another leakage current path from drain 5 to source 4, extending down into the substrate 1 and up along the sides 17 of the buffer region 2 and main semiconductor region 3. The present invention successfully curtails the amount of this leakage current $I_B$ by virtue of the combination of the first antileakage overlay 7 of insulating material and second antileakage overlay 8 of conductive material. What follows is a more detailed discussion of how the invention succeeds in achieving this objective.

During the nonconducting periods of the HEMT, as long as current is flowing laterally through either or both of the substrate 1 and buffer region 2, either or both of them may be considered substantially conductive. Most of the voltage between source 4 and drain 5 will therefore be applied vertically, as seen in FIG. 1, between drain 5 and substrate 1 and vertically between source 4 and substrate 1. The voltage between the vertical extremities of the slanting sides 17 will then be just as high as that between drain 5 and substrate 1 and between source 4 and substrate 1. However, being angled out of the perpendicular, the slanting sides 17 have a longer distance between their top and bottom extremities than if they were perpendicular to the plane of the substrate 1. This means that the slanting sides 17 have a correspondingly less voltage or field strength per unit length in the direction between their top and bottom extremities and, in consequence, that the amount of leakage current $I_B$ along the slanting sides 17 is less than if they were normal to the plane of the substrate 1.

Furthermore, held against the slanting sides 17 via the insulating antileakage overlay 7, the conductive antileakage overlay 8 serves for lessening electric fields adjacent these sides. Leakage current $I_B$ will decrease as electric resistance becomes higher adjacent the slanting sides 17 because of depletion layers created there. The voltage-withstanding capabilities of HEMTs and like semiconductor devices are customarily evaluated as aforesaid in terms of current leakage between source 4 and drain 5 during the nonconducting periods of the devices. A reduction of current leakage is essential for winning favorable valuations of voltage-withstanding capabilities for the devices. Further the semiconductor devices will be saved from breakdown due to current leakage.

The exemplified HEMT of FIGS. 1-3 offers the following additional advantages:

1. The substrate 1 is made from silicon, which is inexpensive and easy of machining, so that the HEMT is lower in manufacturing cost than if the substrate is of sapphire or like more expensive, difficult-of-machining material.
2. Constituted of the alternating first layers 13 of aluminum nitride, which is intermediate in lattice constant between silicon and gallium nitride, and second layers 14 of gallium nitride, the buffer region 2 faithfully conforms to the crystal orientation of the silicon substrate 1. As a result, this buffer region 2 can be overlaid with the main semiconductor region 3 of nitride semiconductors, containing gallium at least, in proper crystal orientation. Further, as the main semiconductor region 3 improves in flatness, the resulting HEMT gains better electrical characteristics. Contrary to the teachings of the instant invention, should the buffer region be fabricated solely from a gallium nitride semiconductor at lower temperatures, the main semiconductor region would not be formed thereon with a desired degree of flatness because of the difference in lattice constant between silicon and gallium nitride.
3. Again constituted of alternating aluminum nitride and gallium nitride layers 13 and 14, the buffer region 2 is capable of growth at higher temperatures than the prior art monolayered buffer region of either gallium nitride or aluminum nitride only. The higher temperature growth of the buffer region leads to a more complete decomposition of ammonia which is usually employed as a nitrogen source, saving the buffer region from becoming amorphous. Still further, grown epitaxially on this buffer region 2, the main semiconductor region 3 has a sufficiently reduced number of crystal defects.
4. Silicon, from which is made the substrate 1, is more conductive of heat than sapphire, so that the heat generated during device operation is favorably liberated from the substrate into the air. Not easily overheating, the HEMT will be better in such characteristics as voltage-withstanding capability and gain.

5. The silicon substrate 1 is less in thermal expansion coefficient than the nitride-based semiconductor regions grown thereon, the latter being therefore subject to tensile straining due to that difference. As a result, the tensile stress at the interface between the electron transit layer 15 of gallium nitride and the electron supply layer 16 of aluminum gallium nitride is further increased for a higher piezoelectric effect. The electron density of the electron transit layer 15 is thus made higher than in the HEMT using a sapphire substrate, so that the sheet resistance of the electron transit layer is decreased for a greater amount of drain current flow.

Figure 4:
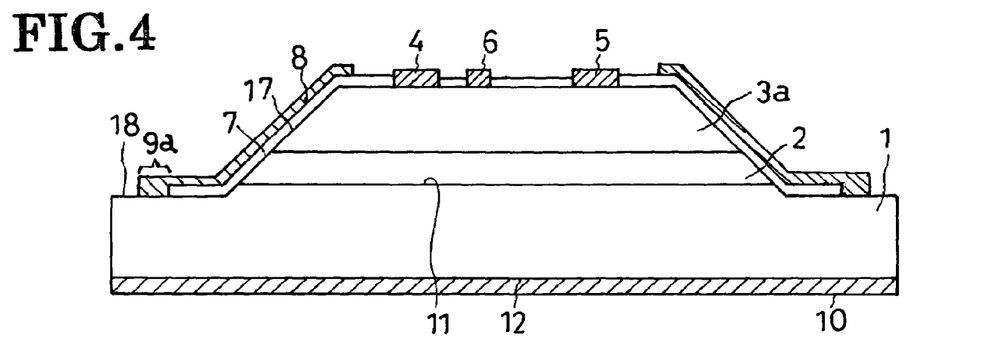
FIG. 4 is a view similar to FIG. 1 but showing a MESFET embodying the principles of the invention.

Embodiment of FIG. 4

In FIG. 4 is shown the present invention as embodied in a MESFET, another possible application of the invention. The MESFET differs from the HEMT of FIG. 1 in a monolayered n-type main semiconductor region $3_a$ employed in substitution for the two-layered main semiconductor region 3 of the HEMT. The n-type main semiconductor region $3_a$ is of gallium nitride, or derivatives thereof, plus an n-type dopant of silicon. Known also as a channel or active layer, the n-type main semiconductor region $3_a$ directly overlies the multilayered buffer region 2. Both source 4 and gate 6 make ohmic contact with the n-type main semiconductor region $3_a$ whereas the gate 6 makes Schottkey contact therewith.

Like its FIG. 1 counterpart 3, the n-type main semiconductor region $3_a$ tapes as it extends away from the buffer region 2. The sides of the n-type main semiconductor region $3_a$, forming parts of the slanting sides 17 of the MESFET, are covered with the conductive antileakage overlay 8 via the insulating antileakage overlay 7.

Another feature of this FIG. 4 embodiment is that the conductive antileakage overlay 8 is ribbed at $9_a$ along its annular bottom edge. The rib $9_a$ makes direct contact with the annular ledge 18 of the silicon substrate 1 in order thereby to be held at a prescribed potential, so that the contact electrode 9 of the FIG. 1 embodiment is absent here. However, the direct contact of the conductive antileakage overlay 8 with the substrate 1 is not an essential feature of the MESFET; instead, the contact electrode 9 could be employed as in FIG. 1.

The MESFET is identical with the HEMT of FIG. 1 in all the other details of construction, so that the various parts of the former other than the n-type main semiconductor region $3_a$ and antileakage overlay rib $9_a$ are identified by the same reference numerals as used to denote the corresponding parts of the FIG. 1 embodiment. It is therefore self-evident that this FIG. 4 embodiment gains the same advantages as that of FIG. 1.

Figure 5:
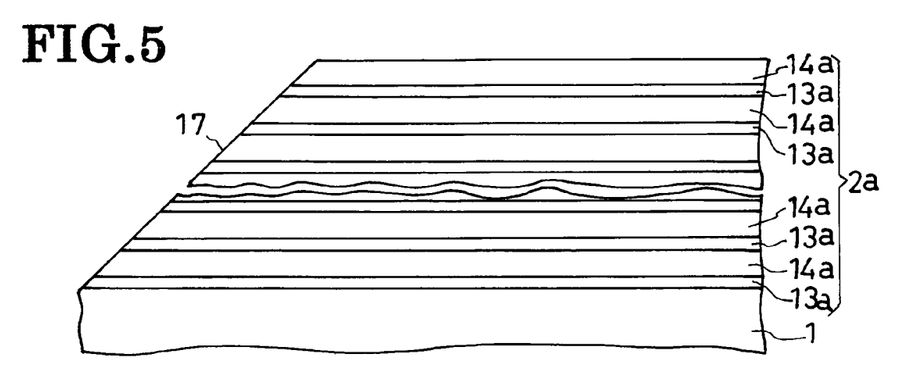
FIG. 5 is a view similar to FIG. 3 but showing another preferred form of multilayered buffer region suitable for use in a semiconductor device according to the invention.

Embodiment of FIG. 5

The multilayered buffer region of both FIGS. 1 and 4 embodiments may contain indium, rather than boron, as in a multilayered buffer region $2_a$ shown in FIG. 5. The modified multilayered buffer region $2_a$ is a lamination of a required number of alternations of indium-containing first layers $13_a$ and indium-containing second layers $14_a$.

The general composition of the first layers $13_a$ of the modified buffer region $2_a$ is then redefined as:

where the subscript x is a numeral that is greater than zero and equal to or less than one; the subscript y is a numeral that is equal to or greater than zero and less than one; and the sum of x and y is equal to or less than one. Specific examples according to this general composition of the first buffer layers $13_a$ include AlN, AlGaN, AlInN, and AlInGaN. Currently believed to be the most desirable composition of the first buffer layers $13_a$ is $Al_{0.5}In_{0.01}Ga_{0.49}N$ (x=0.5, y=0.01). The first buffer layers $13_a$ are much thinner than the second buffer layers $14_a$ but electrically insulating. Containing aluminum, the first buffer layers $13_a$ are intermediate in both lattice constant and thermal expansion coefficient between silicon substrate 1 and main semiconductor region 3 or $3_a$.

The general composition of the second buffer layers $14_a$ is also redefined as:

where the subscripts a and b are both numerals that are equal to or greater than zero and less than one, and the sum of a and b is equal to or less than one. This general compositions of the second buffer layers $14_a$ encompasses such compounds as GaN, AlN, InN, InGaN, AlGaN, AlInN, and AlInGaN. Currently believed to be the most desirable composition of the second buffer layers $14_a$ is $Al_{0.05}In_{0.35}Ga_{0.6}N$ (a=0.05, b=0.35). The second buffer layers $14_a$ are less in bandgap (gap between valence band and conduction band) than the first buffer layers $13_a$. Either p- or n-type dopant might be added to either or both of the first and the second buffer layers $13_a$ and $14_a$.

Containing indium, the multilayered buffer region $2_a$ is closer in thermal expansion coefficient to the silicon substrate 1 than in the absence of indium. The other advantages of this FIG. 5 embodiment are as previously set forth in conjunction with FIGS. 1-3.

Figure 6:
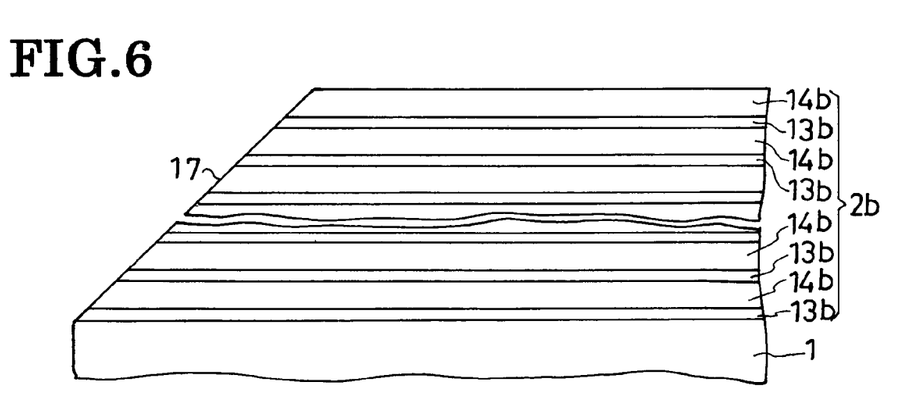
FIG. 6 is also a view similar to FIG. 3 but showing still another preferred form of multilayered buffer region suitable for use in a semiconductor device according to the invention.

Embodiment of FIG. 6

The multilayered buffer region of both FIGS. 1 and 4 embodiments may contain boron, rather than indium, as in a modified buffer region $2_b$ shown in FIG. 6. The modified multilayered buffer region $2_b$ is a lamination of a required number of alternations of boron-containing first layers $13_b$ and boron-containing second layers $14_b$.

The general composition of the first layers $13_b$ of the modified buffer region $2_b$ is then redefined as:

where the subscript x is a numeral that is greater than zero and equal to or less than one; the subscript y is a numeral that is equal to or greater than zero and less than one; and the sum of x and y is equal to or less than one. This general composition of the first buffer layers $13_b$ includes AlN, AlGaN, AlBN, and AlBGaN. Currently believed to be the most desirable composition is $Al_{0.5}Ga_{0.5}N$ (x=0.5, y=0.0). The first buffer layers $13_b$ are much thinner than the second buffer layers $14_b$ but electrically insulating. The first buffer layers $13_b$ are closer in both lattice constant and thermal expansion coefficient to the silicon substrate 1 than are the second buffer layers $14_b$.

The general composition of the second buffer layers $14_b$ is refined as:

where the subscripts a and b are both numerals that are equal to or greater than zero and less than one, and the sum of a and b is equal to or less than one. In other words, the second buffer layers $14_b$ contain at least either one of aluminum, boron and gallium, in addition to nitrogen. The possible compositions of the second buffer layers $14_b$ include GaN, BN, AlN, BGaN, AlGaN, AlBN, and AlBGaN. Currently believed to be the most desirable composition of the second buffer layers $14_b$ is $B_{0.3}Ga_{0.7}N$ (a =0, b=0.3). The second buffer layers $14_b$ are less in bandgap than the first buffer layers $13_b$. Either p- or n-type dopant might be added to either or both of the first and the second buffer layers $13_b$ and $14_b$.

The addition of boron makes the second buffer layers $14_b$ mechanically sturdier, so that these layers can be rendered thicker without fear of cracking. The other advantages of this FIG. 6 embodiment are as previously set forth in conjunction with FIGS. 1-3.

Figure 7:
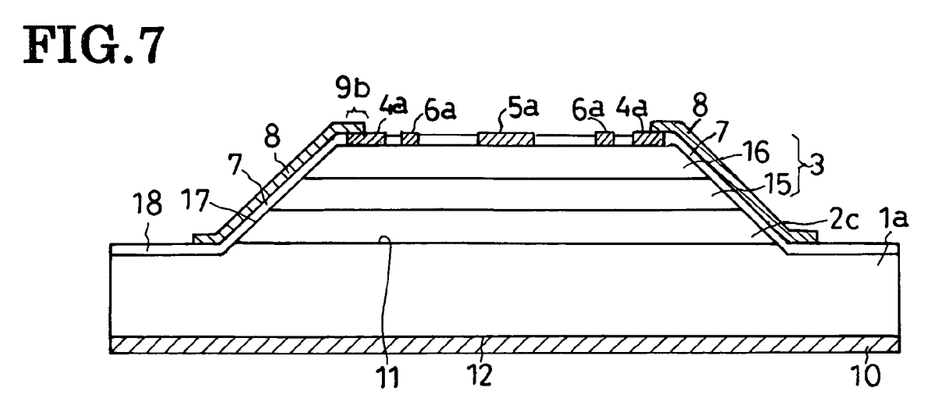
FIG. 7 is a view similar to FIG. 1 but showing a modification of the HEMT illustrated therein.

Embodiment of FIG. 7

The present invention is applicable to semiconductor devices built on a sapphire substrate via a multilayered, low-temperature-grown buffer region. FIG. 7 is an illustration of a HEMT having the main semiconductor region 3 grown on a sapphire substrate $1_a$ via a multilayered, low-temperature-grown buffer region $2_c$. A drain $5_a$ is placed centrally on the top surface of the main semiconductor region 3, and a source $4_a$ and gate $6_a$ of annular shape concentrically surround the drain 5. The conductive antileakage overlay 8 engages the source $4_a$ in electrical contact therewith. The other details of construction are substantially as set forth above with reference to FIGS. 1-3.

The layers of the buffer region $2_c$, are of two or more of GaN, AlN and AlGaN, successively grown epitaxially at comparatively low temperatures of 500 to 600° C. The buffer region $2_c$ and the main semiconductor region 3 thereon, as well as the underlying part of the sapphire substrate $1_a$, taper upwardly like their FIG. 1 counterparts.

The conductive antileakage overlay 8 covers the sides 17 of the buffer region $2_c$ and main semiconductor region 3 via the insulating antileakage overlay 7 as in all the preceding embodiments. In this embodiment, however, the conductive antileakage overlay 8 has an annular extension $9_b$ from its upper or inside edges. Having this annular extension $9_b$ held against the annular source $4_a$, the conductive antileakage overlay 8 is maintained at the source potential, in contrast to the overlay 8 of the FIG. 1 embodiment which is fixed at the substrate potential via the contact electrode 9.

The HEMT of FIG. 7 with its tapering sides 17 and antileakage overlays 7 and 8 thereon suffers less current leakage than heretofore. The arrangement of the source $4_a$, drain $5_a$ and gate $6_a$, and the connection of the conductive antileakage overlay 8 to the source $4_a$, are applicable to the embodiments of FIGS. 1, 4 and 6 as well.

Figure 8:
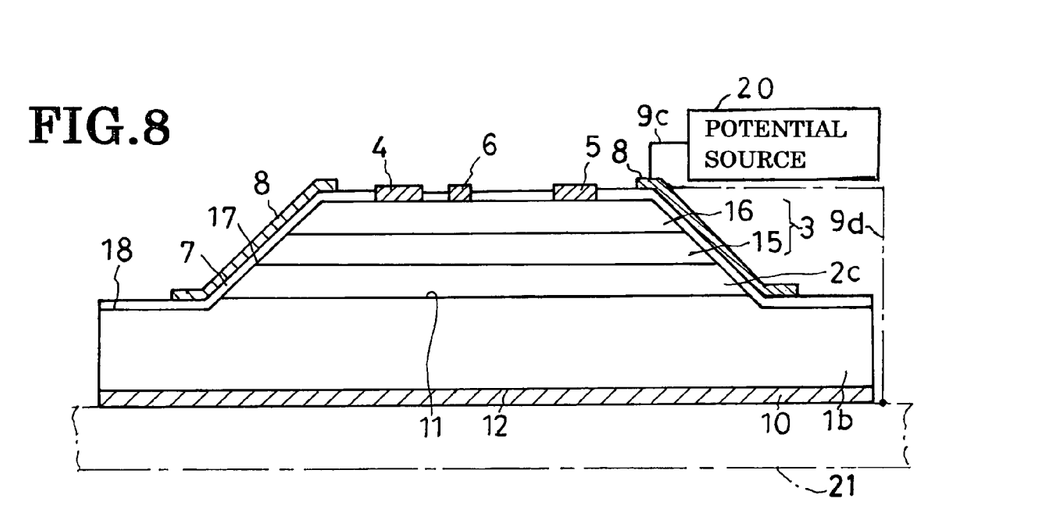
FIG. 8 is also a view similar to FIG. 1 but showing another modification of the HEMT illustrated therein.

Embodiment of FIG. 8

The HEMT shown in FIG. 8 differs from the FIG. 1 device in having a substrate $1_b$ of silicon carbide in substitution for the silicon substrate 1, and the low-temperature-grown buffer region $2_c$ in substitution for the buffer region 2, and in having no contact electrode 9. The other details of construction are as described above with reference to FIGS. 1-3.

The buffer region $2_c$ and main semiconductor region 3 are both grown as aforesaid on the silicon carbide substrate $1_b$. The conductive antileakage overlay 8 is held against the slanting sides 17 of the buffer region $2_c$, main semiconductor region 3 and part of the substrate $1_b$ via the insulating antileakage overlay 7 as in all the foregoing embodiments but not electrically coupled to the substrate or to the main semiconductor region. The conductive antileakage overlay 8 is connected instead to an external source of electric potential 20 such as an electrode, a body of conductor or semiconductor, or an electric circuit capable of applying a prescribed potential to the overlay via a conductor $9_c$.

A possible alternative to the potential source 20, or an additional example thereof, is a metal-made baseplate indicated in phantom outline and designated 21 in FIG. 8. The baseplate 21 is fastened to the bottom surface 12 of the substrate $1_b$ via the bonding metal layer 10 and has a constant potential such as that of the ground or chassis. The conductive antileakage overlay 8 may be electrically coupled to the baseplate 21 via wire or like conductor $9_d$.

It is thus seen that the conductive antileakage overlay 8 may not necessarily be hardwired to the substrate 1 or $1_b$ or to the main semiconductor region 3 as in the preceding embodiments. As long as being held at a constant potential by the potential source 20 or baseplate 21, the antileakage overlay 8 will work in coaction with the insulating overlay 7 for field mitigation on the slanting sides 17 and for curtailment of current leakage. Possibly, moreover, the conductive antileakage overlay 8 may be coupled to none of the substrate 1 or $1_b$, source electrode 4, potential source 20, baseplate 21, or any other equivalent means. Even then the superposed overlays 7 and 8 will conduce to the stabilization of potential on the sides 17 of the buffer region 2, $2_a$, $2_b$ or $2_c$ and main semiconductor region 3 or $3_a$ and hence to leakage current reduction. The conductive overlay 8 could be connected to the external potential source 20 or to the baseplate 21 in the embodiments of FIGS. 1, 4, 5, 6 and 7.

Figure 9:
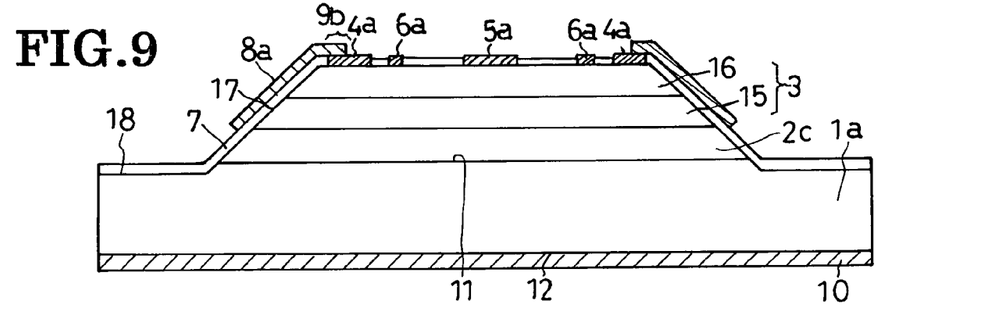
FIG. 9 is also a view similar to FIG. 1 but showing still another modification of the HEMT illustrated therein.

Embodiment of FIG. 9

The HEMT shown in FIG. 9 is akin to that of FIG. 7 except for a conductive antileakage overlay $8_a$ which is held only against the sides of the main semiconductor region 3 via the insulating antileakage overlay 7. Although less in size, the overlay $8_a$ has proved to accomplish the objective of leakage current reduction to some extent. A full coverage of the slanting sides 17 by the overlay 8, as in the FIG. 7 embodiment, is nevertheless preferable for more effective reduction of current leakage.

The teaching of FIG. 9 is applicable to the embodiments of FIGS. 1, 4 and 8. Further, in all the embodiments disclosed herein, the overlays 7 and 8 could be held against only the multilayered buffer region 2, $2_a$, $2_b$ or $2_c$.

Possible Modifications

Notwithstanding the foregoing detailed disclosure it is not desired that the present invention be limited by the exact showings of the drawings or the description thereof. The following is a brief list of possible modifications, alterations or adaptations of the illustrated semiconductor devices which are all believed to fall within the purview of the claims annexed hereto:

1. The HEMT semiconductor region 3 of FIGS. 1, and 7-9 is interchangeable with the MESFET semiconductor region $3_a$ of FIG. 4.
2. In use of the silicon substrate 1, if that layer of the main semiconductor region 3 or $3_a$ which immediately adjoins the multilayered buffer region 2, $2_a$ or $2_b$ is of an n-type or n-like semiconductor, a p-type dopant may be introduced into one or more of the second layers 14, or either or both of the first and the second layers 13 and 14, of the buffer region. A pn junction thus created between buffer region 2, $2_a$ or $2_b$ and main semiconductor region 3 or $3_a$ will limit current leakage through the buffer region. Additional pn junctions created internally of the buffer region 2, $2_a$ or $2_b$ will also limit current leakage through the buffer region.

3. Current leakage through the multilayered buffer region 2, $2_a$ or $2_b$ will be further curtailed by incorporating third buffer layers into the buffer region in alternation with the first and the second. The antileakage overlays 7 and 8 will perform the functions for which they are intended, even in cases where the buffer region 2, $2_a$ or $2_b$ is itself configured for current leakage reduction.

4. The sides 17 of part of the substrate 1 or $1_a$, the buffer region 2, $2_a$-$2_c$ and the main semiconductor region 3 may be, though not necessarily, at an angle of from about 20 to abut 70 degrees to the major surface of the substrate 1, $1_a$ or $1_b$.

5. The constituent layers of the main semiconductor region 3 or $3_a$ may be made from any such nitrides as GaN, AlInN, AlGaN, InGaN, and AlInGaN.

6. In the HEMT of FIG. 1 another electron supply layer similar to that shown at 16 could be provided between buffer layer 2 and electron transit layer 15.

7. In the embodiments of FIGS. 7 and 9 the source 4 could be disposed centrally on the main semiconductor region 3, and the drain 5 and gate 6 concentrically around the source, with the drain outwardly of the gate. The conductive antileakage overlay 8 could then be coupled to the drain. Another alternative to the same embodiments is to arrange the gate 6 outwardly of the sour 4, and to connect the overlay 8 to the gate.

8. The invention is applicable to insulated-gate field-effect transistors and like semiconductor devices other than HEMTs and MESFETs, or indeed to any semiconductor devices in which current leakage between electrodes on the main semiconductor region is a problem.

What is claimed is:

1. A nitride-based semiconductor device of reduced current leakage, the semiconductor device comprising:
    (a) a substrate having a major surface;
    (b) a buffer region formed on the major surface of the substrate, the buffer region having a side surface;
    (c) a main semiconductor region having at least one nitride-based semiconductor layer formed on the major surface of the substrate via the buffer region, the main semiconductor region having a side surface;
    (d) a set of electrodes on the main semiconductor region;
    (e) a first antileakage overlay of electrically insulating material covering at least either of the side surfaces of the buffer region and the main semiconductor region; and
    (f) a second antileakage overlay of electroconductive material covering at least either of the side surfaces of the buffer region and the main semiconductor region via the first antileakage overlay.

2. A nitride-based semiconductor device as defined in claim 1, wherein the main semiconductor region tapers as the same extends away from the substrate, so that the side surface of the main semiconductor region is angled with respect to the major surface of the substrate, and wherein the first and the second antileakage overlay cover the angled side surface of the main semiconductor region.

3. A nitride-based semiconductor device as defined in claim 1, wherein the buffer region and the main semiconductor region taper as they extend away from the substrate, so that the side surfaces of the buffer region and the main semiconductor region are angled with respect to the major surface of the substrate, and wherein the first and the second antileakage overlay cover the angled side surfaces of the buffer region and the main semiconductor region.

4. A nitride-based semiconductor device as defined in claim 1, wherein part of the substrate, the buffer region and the main semiconductor region taper as they extend away from the rest of the substrate substrate, so that a side surface of said part of the substrate and the side surfaces of the buffer region and the main semiconductor region are angled with respect to the major surface of the substrate, and wherein the first and the second antileakage overlay cover the angled side surfaces of said part of the substrate and of the buffer region and the main semiconductor region.

5. A nitride-based semiconductor device as defined in claim 1, wherein the substrate is of electroconductive material, and wherein the second antileakage overlay is electrically coupled to the substrate.

6. A nitride-based semiconductor device as defined in claim 1, wherein the second antileakage overlay is electrically coupled to one of the electrodes.

7. A nitride-based semiconductor device as defined in claim 1, wherein the substrate is made from a substance selected from among silicon, a silicon compound, and sapphire.

8. A nitride-based semiconductor device as defined in claim 1, wherein the substrate is of silicon or a compound thereof, and wherein the buffer region is a lamination of at least one first layer and at least one second layer, the first layer of the buffer region being made from any of nitrides that are generally defined by the formula:

$$Al_xM_yGa_{1-x-y}N$$

where M is at least either of indium and boron; the subscript x is a numeral that is greater than zero and equal to or less than one; the subscript y is a numeral that is equal to or greater than zero and less than one; and the sum of x and y is equal to or less than one; the second layer of the buffer region being made from any of nitrides that are generally defined by the formula:

$$Al_aM_bGa_{1-a-b}N$$

where M is at least either of indium and boron; the subscript a is a numeral that is equal to or greater than zero and equal to or less than one; the subscript b is a numeral that is equal to or greater than zero and less than one; and the sum of a and b is equal to or less than one.

9. A nitride-based semiconductor device as defined in claim 8, wherein the buffer region is a lamination of a prescribed number of alternations of the first and the second layer.

10. A nitride-based semiconductor device as defined in claim 1, wherein the electrodes includes a control electrode for controlling current flow between two other electrodes, and wherein the main semiconductor region is configured to provide a semiconductor switch controllable by the control electrode.

* * * * *